United States Patent
Nakayama et al.

(10) Patent No.: US 7,257,012 B2
(45) Date of Patent: Aug. 14, 2007

(54) NONVOLATILE SEMICONDUCTOR MEMORY DEVICE USING IRREVERSIBLE STORAGE ELEMENTS

(75) Inventors: Atsushi Nakayama, Kawasaki (JP);
Toshimasa Namekawa, Tokyo (JP);
Hiroaki Nakano, Yokohama (JP);
Hiroshi Ito, Yokohama (JP); Osamu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 11/231,795

(22) Filed: Sep. 22, 2005

(65) Prior Publication Data
US 2006/0133167 A1 Jun. 22, 2006

(30) Foreign Application Priority Data
Dec. 17, 2004 (JP) ............... 2004-366446

(51) Int. Cl.
*G11C 17/00* (2006.01)
(52) U.S. Cl. .............. 365/96; 365/94; 365/195; 365/201
(58) Field of Classification Search ......... 365/94–105, 365/195, 201
See application file for complete search history.

(56) References Cited
U.S. PATENT DOCUMENTS 5,357,471 A * 10/1994 Alapat ................ 365/201
5,886,940 A * 3/1999 Morzano et al. ....... 365/230.03
7,046,569 B2 * 5/2006 Ito et al. ............... 365/230.03
7,180,764 B2 * 2/2007 Kim et al. .................. 365/94

OTHER PUBLICATIONS

Hiroshi Ito, et al., "Pure CMOS One-time Programmable Memory using Gate-Ox Anti-fuse", IEEE 2004 Custom Integrated Circuits Conference, 2004, pp. 469-472.
U.S. Appl. No. 11/231,983, filed Sep. 22, 2005, Nakano et al.

* cited by examiner

*Primary Examiner*—VanThu Nguyen
(74) *Attorney, Agent, or Firm*—Oblon, Spivak, McClelland, Maier & Neustadt, P.C.

(57) ABSTRACT

A nonvolatile semiconductor memory device comprising a storage element which is programmed with information by varying electrical properties irreversibly, a selection switch connected in series to the storage element, a protection element connected in parallel to the storage element to protect the storage element from irreversible variations of electrical properties when the storage element is unprogrammed, a first activation circuit which activates the selection switch, a second activation circuit which activates the protection element in complement with the first activation circuit in normal mode, and a test circuit which conducts a test on the storage element while the second activation circuit is activating the protection element together with the first activation circuit in test mode.

19 Claims, 4 Drawing Sheets

NONVOLATILE SEMICONDUCTOR MEMORY DEVICE USING IRREVERSIBLE STORAGE ELEMENTS

CROSS-REFERENCE TO RELATED APPLICATIONS

This application is based upon and claims the benefit of priority from prior Japanese Patent Application No. 2004-366446, filed Dec. 17, 2004, the entire contents of which are incorporated herein by reference.

BACKGROUND OF THE INVENTION

1. Field of the Invention

The present invention relates to a nonvolatile semiconductor memory device. More specifically, the invention relates to a one-time programmable (OTP) memory using irreversible storage elements to which information can be written only once.

2. Description of the Related Art

Recently, an OTP memory using storage elements of an insulating film breakdown type, such as an electrical-fuse element (e-fuse element) and an anti-fuse element, has been proposed as an irreversible storage element. The OTP memory stores information by applying a high voltage that exceeds the maximum rating to a semiconductor element having a metal oxide semiconductor (MOS) structure as an irreversible storage element and electrically breaking a gate insulating film of the semiconductor element. The OTP memory using the e-fuse element as a storage element is used to store information "0" in the e-fuse element whose insulating film has not been broken and information "1" in the e-fuse element whose insulating film has been broken. The OTP memory is also used to store information for replacing a defective element with a dynamic random access memory (DRAM) or the like.

Conventionally, an OTP memory using an optical-fuse element whose storage node is broken by laser beams as a storage element has been often used. The e-fuse element has originally been used as an alternative to the optical-fuse element. The following example has been proposed: one storage cell is configured for each e-fuse element to include a sense circuit for reading information and a latch circuit for latching the information. See, for example, H. Ito et al., "Pure CMOS One-Time Programmable Memory using Gate-Ox Anti-Fuse," Proceedings of the IEEE 2004 Custom Integrated Circuits Conference, pp. 469-472.

The OTP memory using the e-fuse element as a storage element is a nonvolatile semiconductor memory device to which information cannot be rewritten. It has the problem that it cannot easily be tested like the OTP memory using the optical-fuse element as a storage element. The e-fuse element is a storage element to which information can be written only once by varying electrical properties irreversibly. The OTP memory therefore has the following problem. Neither a test on whether information can correctly be read out of the e-fuse element nor a test on whether information can correctly be written to the e-fuse element can be conducted by actually writing information to the e-fuse element.

The OTP memory has also the following problem. The amount of information of the e-fuse element (a difference in resistance between the e-fuse element whose gate insulating film has been broken and the e-fuse element whose gate insulating film has not been broken) is easy to reduce because a high voltage in write mode is applied to the nonselected (unprogrammed).

As described above, the OTP memory using an irreversible storage element, especially the OTP memory using the e-fuse element as a storage element has pursued an effective method of preventing the amount of information from decreasing and conducting a test on whether information can be read from/written to a storage element without writing information to the storage element actually.

BRIEF SUMMARY OF THE INVENTION

According to a first aspect of the present invention, there is provided a nonvolatile semiconductor memory device comprising: a storage element which is programmed with information by varying electrical properties irreversibly; a selection switch connected in series to the storage element; a protection element connected in parallel to the storage element to protect the storage element from irreversible variations of electrical properties when the storage element is unprogrammed; a first activation circuit which activates the selection switch; a second activation circuit which activates the protection element in complement with the first activation circuit in normal mode; and a test circuit which conducts a test on the storage element while the second activation circuit is activating the protection element together with the first activation circuit in test mode.

According to a second aspect of the present invention, there is provided a nonvolatile semiconductor memory device comprising: a cell array including a plurality of storage cells arranged in matrix, each of the storage cells having a storage element which is programmed with information by varying electrical properties irreversibly, a selection switch connected in series to the storage element, and a protection element connected in parallel to the storage element to protect the storage element from irreversible variations of electrical properties when the storage element is programmed; a row selection control circuit which activates row selection lines to each of which a given number of storage cells are connected; a first activation circuit which activates the selection switch of the given number of storage cells connected to each of the row selection lines activated by the row selection control circuit; a second activation circuit which activates the protection elements in complement with the first activation circuit in normal mode; and a test circuit which conducts a test on the storage element of each of the given number of storage cells connected to each of the row selection lines while the second activation circuit is activating the protection elements together with the first activation circuit in test mode.

DETAILED DESCRIPTION OF THE INVENTION

Embodiments of the present invention will be described below with reference to the accompanying drawings.

FIRST EMBODIMENT

Figure 1:
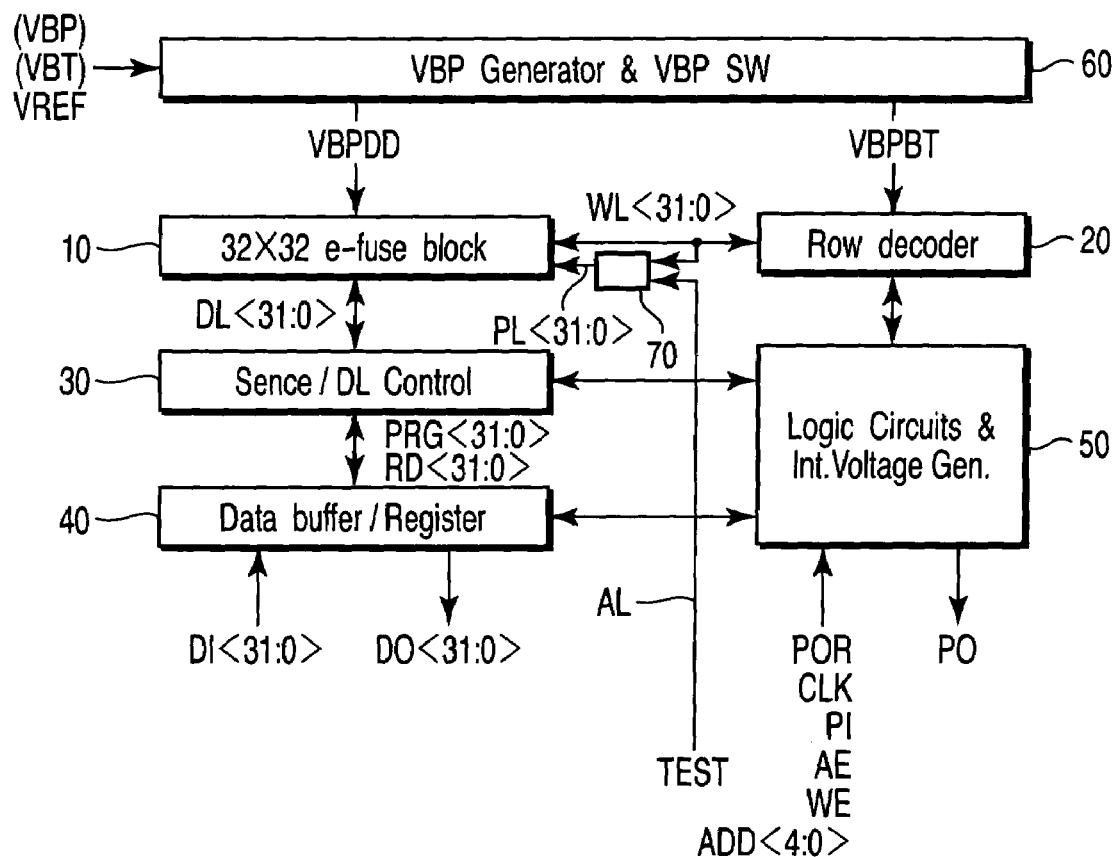
FIG. 1 is a block diagram of an OTP memory according to a first embodiment of the present invention.

FIG. 1 shows an OTP memory (nonvolatile semiconductor memory device) according to a first embodiment of the present invention, using an e-fuse element (a semiconductor element having a MOS structure) as a storage element. The OTP memory can be written with information only once. Assume here that the OTP memory includes a 1024-bit (32 bits×32 bits) cell array.

Referring to FIG. 1, the OTP memory includes a cell array 10, a row decoder section 20 serving as a row selection control circuit, a sense/data line control section 30, a buffer/data register section 40, an internal potential generation circuit/logic circuit section 50, a voltage control block 60 for controlling a voltage to be applied to a high voltage generation circuit and each of components of the OTP memory, and a test control circuit section 70 serving as first and second activation circuits.

In the first embodiment, the sense/data line control section 30 composes a test circuit including a write control circuit and a read control circuit (read circuit), both of which will be described later.

Figure 2:
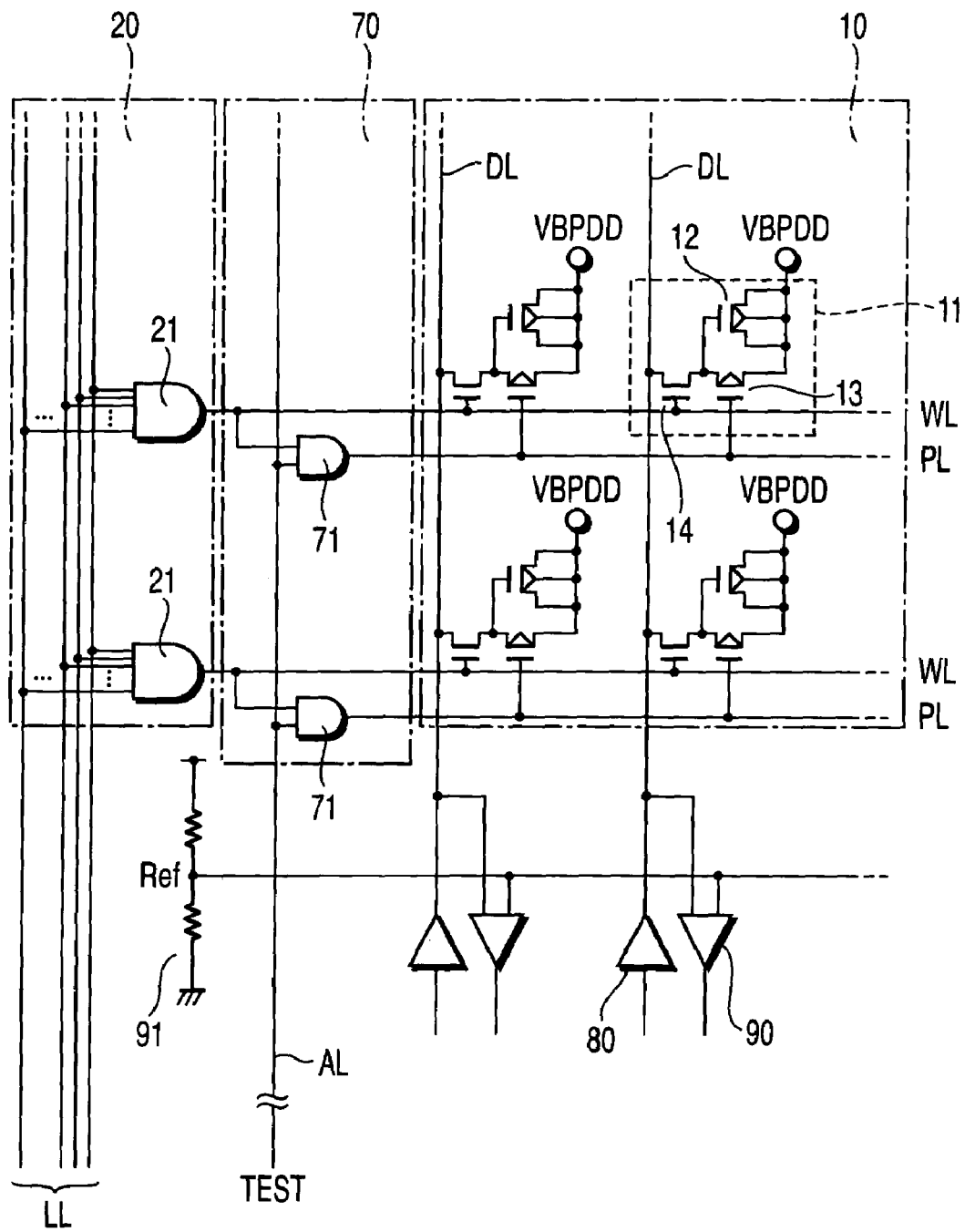
FIG. 2 is a circuit arrangement of the principal part of the OTP memory shown in FIG. 1.

FIG. 2 shows the principal part of the OTP memory shown in FIG. 1. More specifically, FIG. 2 shows a basic arrangement of the cell array 10, row decoder section 20, test control circuit section 70, write control circuit 80 and read control circuit 90. These are configured to conduct a test on whether information can be written to/read from unprogrammed e-fuse elements by activating a protection transistor (protection element) in test mode.

The cell array 10 includes a plurality of storage cells (storage units) 11 arranged in matrix (32 bits×32 bits) as shown in FIG. 2. Each of the storage cells 11 has an e-fuse element 12 with two terminals, a protection transistor (p-type MOS transistor) 13 for decreasing a voltage (high electric field) to be applied to the e-fuse element 12 in unprogrammed state, and an n-type MOS transistor 14 serving as a selection transistor (selection switch) for controlling a connection between each of the e-fuse element 12 and the protection transistor 13 and a data line DL (DL<31:0>). The protection transistor 13 is connected in parallel to the e-fuse element 12 and connected in series to the n-type MOS transistor 14. These transistors are driven complementarily to each other.

In each of the storage cells 11, the voltage control block 60 applies a potential VBPDD to one of the terminals (substrate, source and drain) of the e-fuse element 12 and one of source and drain terminals of the protection transistor 13. The other terminal (gate) of the e-fuse element is connected to a node between the other terminal of the protection transistor 13 and one of source and drain terminals of the n-type MOS transistor 14.

The gate terminal of the n-type MOS transistor 14 is connected to its corresponding one of thirty-two word lines (row selection lines) WL (WL<31:0>). The other of the source/drain terminals of the n-type MOS transistor 14 is connected to its corresponding one of thirty-two data lines DL that intersect the word lines WL almost at right angles.

Of the storage cells 11 for 1024 bits arranged in matrix, the storage cells 11 for every 32 bits arranged in row direction are connected to a common word line WL. The word line WL is driven by its corresponding one of row decoder circuits (selectors) 21 that make up the row decoder section 20. If one word line WL is driven by its corresponding row decoder circuit 21, the storage cells 11 for 32 bits connected to the word line WL are selected at the same time.

Similarly, the storage cells 11 for every 32 bits arranged in column direction are connected to a common data line DL. The data line DL is controlled by its corresponding write control circuit 80 and read control circuit 90. If one data line DL is controlled by its corresponding circuits 80 and 90, a desired storage cell 11 can be selected from the storage cells 11 for 32 bits arranged in row direction.

The gate terminal of the protection transistor 13 is connected to its corresponding one of thirty-two protection element driving lines PL (PL<31:0>) that are arranged along the word lines WL, respectively. Of the storage cells 11 for 1024 bits arranged in matrix, the storage cells 11 for every 32 bits arranged in row direction have protection transistors 13 connected to a common protection element driving line PL. The protection element driving line PL is driven by its corresponding one of selection driving circuits 71. The circuits 71 make up the test control circuit section 70 and each have an AND circuit.

A normal operation signal line AL for supplying a normal operation signal is connected to one of input terminals of each of the selection driving circuits 71. One of word lines WL is connected to the other input terminal of each of the selection driving circuits 71. In normal operation mode such as information write (programming) mode and information read (reading) mode, the above normal operation signal is activated and so is a protection element driving line PL corresponding to the selected (activated) word line WL by the corresponding selection driving circuit 71. Thus, the protection transistors 13 of the storage cells 11 for 32 bits connected to the same protection element driving line PL are all inactivated.

In normal operation mode, the protection element driving lines PL corresponding to word lines WL not selected (activated) are inactivated by their respective selection driving circuits 71. Thus, the protection transistors 13 of the storage cells 11 for 32 bits connected to the same protection element driving line PL are all activated. In other words, the protection transistors 13 are activated in the storage cells 11 whose word line WL is inactive.

As described above, the source and drain terminals of each of the protection transistors 13 are connected between one terminal (substrate, source and drain) of the e-fuse element 12 and the other terminal (gate). If, therefore, the protection transistor 13 is activated, both the terminals of the e-fuse element 12 in a non-selected storage cell are short-circuited and the voltage to be applied to the e-fuse element 12 is decreased.

When a storage cell 11 is not selected (e.g., test mode), or when no information is written or read, the above normal operation signal is inactivated upon receipt of a test signal TEST from an external tester, an internal controller (not shown) and the like. Then, all the protection element driving lines PL are inactivated by their respective selection driving circuits 71. Accordingly, the protection transistors 13 are activated at the same time.

When the normal operation signal is active, the protection element driving line PL and word line WL corresponding to each of the row decoder circuits 21 are driven. When a storage cell 11 is selected, its corresponding protection transistor 13 is always inactivated. On the other hand, when the storage cell 11 is not selected, the protection transistor 13 is always activated. This configuration can inhibit a high voltage from being applied to the nonselected (unprogrammed) e-fuse element 12 in write mode. It is thus possible to suppress a reduction in the amount of information of the e-fuse element 12, which is caused by coupling due to parasitic capacitance.

When the normal operation signal is inactive (e.g., a test signal TEST is input), the protection transistor 13 is always activated. When the protection transistor 13 is active, both the terminals of the e-fuse element 12 are short-circuited, and a potential VBPDD is applied to the other terminal (gate) of the e-fuse element 12. This can be considered to be a situation in which the gate insulating film of the e-fuse element 12 is broken (the e-fuse element 12 is programmed). For this reason, when the protection transistor 13 is active, a test on whether information can be read from the e-fuse element 12 can be conducted before the information is written thereto, if a power supply voltage VBT (an intermediate potential of the word line WL in data read mode) is applied to the gate terminal of the n-type MOS transistor 14 in the selected storage cell 11.

Similarly, when the protection transistor 13 is active, a test on whether information can be written to the e-fuse element 12 can be conducted before the information is written thereto, if a potential VBPDD is set at a high potential VBP (a high voltage that exceeds the maximum rating of the e-fuse element 12) in the selected storage cell 11.

The row decoder section 20 includes a plurality of row decoder circuits 21 (thirty-two row decoder circuits in the first embodiment). The row decoder circuits 21 are provided for their respective word lines WL. A plurality of (at least four) row address lines LL are connected to each of the row decoder circuits 21. Each of the row decoder circuits 21 drives its corresponding word line WL in response to a row address signal ADD <4:0> that is supplied through the row address lines LL. The voltage control block 60 applies a potential VBPBT to the row decoder section 20, as shown in FIG. 1.

The sense and data line control section 30 is made up chiefly of the write control circuit 80 and the read control circuit 90. These circuits 80 and 90 are provided for each of data lines DL, as shown in FIG. 2. The read control circuit 90 is a sense amplifier (SA) that senses information (e.g., voltage value) read onto the data line DL from the storage cells 11 by comparing it with a reference value Ref generated from a reference potential generation circuit 91. The write control circuit 80 precharges the data line DL and programs a desired storage cell 1 with information (applies a stress). When write data of data input signal DI is "1," the write control circuit 80 controls its corresponding data line DL such that its voltage becomes low. Of the data lines DL precharged with a high voltage, data lines connected to storage cells 11 that are to be written with data "1" are discharged at once. Information can thus be written at once to the storage cells 11 for 32 bits arranged in row direction.

The buffer and data register section 40 is used to transfer data between an external device and each of the sense/data line control section 30 and the internal potential generation circuit/logic circuit section 50. As shown in FIG. 1, the section 40 controls data input signal DI <31:0> and data output signal DO <31:0>.

As illustrated in FIG. 1, the internal potential generation circuit/logic circuit section 50 receives various control signals from a controller (not shown) to generate a new control signal and an internal potential used for controlling the read control circuit 90.

As illustrated in FIG. 1, the voltage control block 60 includes a power supply circuit that generates and supplies a potential VBPDD and a potential VBPBT. The voltage control block 60 controls the potential VBPDD such that it is set at a potential VBP (a high voltage that exceeds the maximum rating of the e-fuse element 12) in programming mode, it is set at a power supply voltage VDD in data read mode, and it is set at 0V in standby mode. The voltage control block 60 also controls the potential VBPBT such that it is set at a potential VBP (a high voltage that exceeds the maximum rating of the e-fuse element 12) in programming mode, it is set at a power supply voltage VBT in data read mode (an intermediate potential of the word line WL in read mode), and it is set at 0V in standby mode.

In the first embodiment, the potential VBPDD is applied to all the storage cells 11 in programming mode and thus the high potential VBP is also applied to a non-selected storage cell 11 that is not to be programmed. However, the activation of the protection transistor 13 prevents the high potential VBP from being applied to both terminals of the e-fuse element 12 in the non-selected storage cell 11.

When the protection transistor 13 is active, a data read operation is performed to conduct a pseudo-test on the same condition of the unprogrammed e-fuse element 12 as that of the element 12 that has been programmed. If the protection transistor 13 is activated, information different from information actually stored in the e-fuse element 12 can be read out as if the gate insulating film of the e-fuse element 12 were broken. It is thus possible to conduct a test on whether information can be written to or read from the e-fuse element 12 without actually writing the information to the e-fuse element 12.

Figure 3:
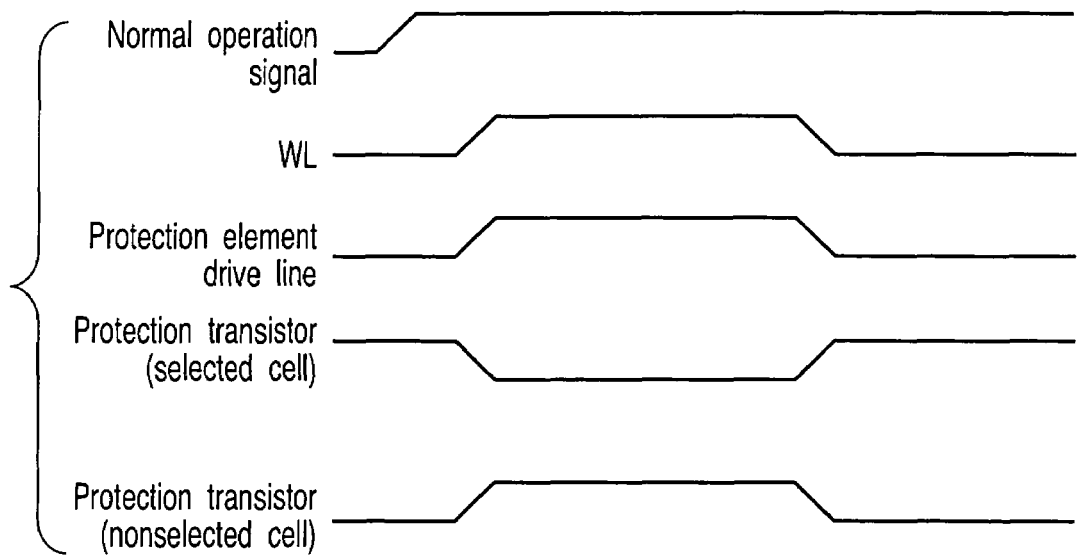
FIG. 3 is a timing chart illustrating a program operation of the OTP memory shown in FIG. 1.

FIG. 3 shows operation timing of the OTP memory described above. The data write operation (programming operation) of the OTP memory will be described briefly with reference to FIG. 3. In the OTP memory, a power supply system (not shown) supplies at least three power supply voltages: a power supply voltage VDD of a logic circuit or the like, an intermediate potential VBT used for controlling the word line WL to transfer information of the e-fuse element 12 with efficiency in data read mode, and a high potential VBP for breaking the gate insulating film of the e-fuse element 12.

When the e-fuse element 12 is programmed, a normal operation signal to be supplied to the normal operation signal line AL is activated as shown in FIG. 3. Then, the word line WL and data line DL corresponding to a storage cell 11 to which information is written are activated. In other words, one word line WL corresponding to an externally input row address signal ADD <4:0> is driven by its corresponding row decoder circuit 21. As the word line WL is activated, its corresponding protection element driving line PL is activated by the selection driving circuit 71. All the protection transistors 13 connected to the same protection element driving line PL are therefore inactivated when the e-fuse element 12 is programmed.

If, in this state, a high potential VBP is applied to the selected storage cell 11 to break the gate insulating film of the e-fuse element 12, information is written thereto. Since the protection transistors 13 of non-selected storage cells 11 are activated, the voltage to be applied to the non-selected e-fuse elements 12 can be decreased.

Similarly, an intermediate potential VBT is applied to a selected storage cell 11 in read mode to read information.

Figure 4:
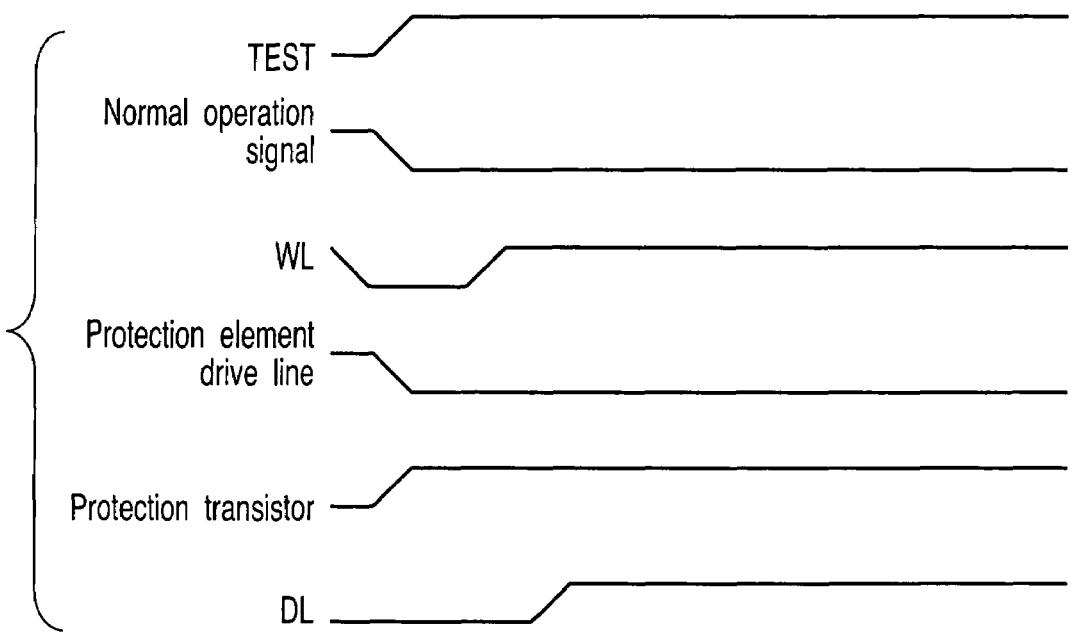
FIG. 4 is a timing chart illustrating an operation of the OTP memory shown in FIG. 1 in test mode.

FIG. 4 shows the operation timing of the OTP memory described above. A test on whether data can be read from/ written to the unprogrammed e-fuse element will be described briefly with reference to FIG. 4. For example, when a test on whether data can correctly be read from the unprogrammed e-fuse element without actually writing information thereto is conducted, the normal operation signal of a normal operation signal line AL is inactivated upon receipt of a test signal TEST. Thus, all the protection element driving lines PL are inactivated irrespective of the state of the corresponding word line WL. Accordingly, all the protection transistors 13 connected to the protection element driving lines PL are activated.

If a normal read operation is performed in the above state, a selected storage cell 11 supplies a data line DL with information other than the actually stored information. In other words, an output signal (e.g., a high voltage or a large current corresponding to the intermediate potential VBT) is supplied to the data line DL as if the gate insulating film of the e-fuse element 12 were broken. If, therefore, the output signal is captured through, e.g., the read control circuit 90, the controller can conduct a pseudo test on whether information can be read out of the unprogrammed e-fuse element 12.

Similarly, when a test on whether information can be written correctly to the unprogrammed e-fuse element without actually writing the information thereto is conducted, a normal program is executed while all the protection transistors 13 are active. A selected storage cell 11 supplies a data line DL with information other than the actually stored information. In other words, an output signal (e.g., a high voltage or a large current corresponding to the high potential VBP) is supplied to the data line DL as if the gate insulating film of the e-fuse element 12 were broken. If, therefore, the output signal is captured through, e.g., the read control circuit 90, the controller can conduct a pseudo test on whether data can be written to the unprogrammed e-fuse element 12.

When the protection transistor 13 is active, an output signal appearing on a data line DL is detected (to discriminate between 0 and 1). In data read test mode, a pseudo test on whether information can be read out of the e-fuse element 12 can be conducted in accordance with whether a voltage VBT necessary for reading the information is applied to the unprogrammed e-fuse element 12. Similarly, in data write test mode, a pseudo test on whether information can be written the e-fuse element 12 can be conducted in accordance with whether a voltage VBP necessary for writing the information is applied to the unprogrammed e-fuse element 12.

As described above, a signal can be output from the unprogrammed e-fuse element as if the gate insulating film of the e-fuse element were broken. In other words, in test mode, a signal is output from a storage cell when a voltage corresponding to reading is applied to the e-fuse element or when a voltage corresponding to writing is applied to the e-fuse element. Information other than information actually stored in the unprogrammed e-fuse element can be read out. A pseudo test on whether information can be written to and read from the e-fuse element without actually writing information to the e-fuse element can easily be conducted.

SECOND EMBODIMENT

Figure 5:
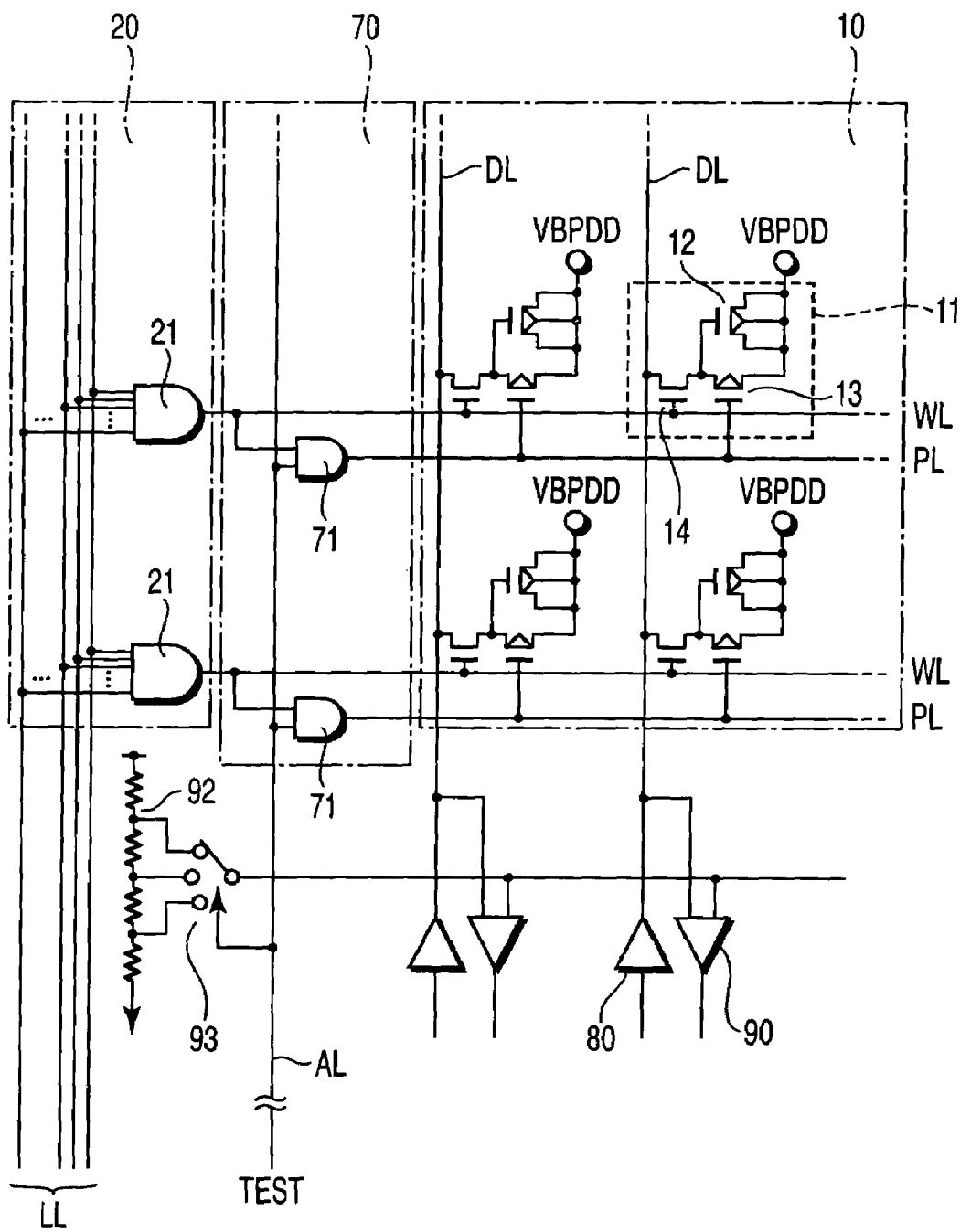
FIG. 5 is a circuit diagram of the principal part of an OTP memory according to a second embodiment of the present invention.

FIG. 5 shows the principal part of an OTP memory (nonvolatile semiconductor memory device) according to a second embodiment of the present invention, which uses an e-fuse element as a storage element. In this OTP memory, the operating point (reference value Ref serving as a threshold value) of a sense amplifier in a read control circuit 90 can be changed. The same components as those of FIG. 2 are denoted by the same reference numerals and their detailed descriptions are omitted.

According to the second embodiment, three or more resistance elements are connected in series to form a reference potential generation circuit (threshold value generation circuit) 92, as shown in FIG. 5. The reference potential generation circuit 92 has two or more different set values. One of the set values is selected by a selection switch 93. The selection switch 93 is controlled in accordance with the status of a normal operation signal in a normal operation signal line AL.

When the normal operation signal is active, the selection switch 93 selects a first set value obtained by dividing a power supply voltage VDD. The selected first set value is supplied to the read control circuit 90 as a reference value Ref. In normal read mode, therefore, a sense operation is performed using the first set value as the reference value Ref (to discriminate between 0 and 1).

When the normal operation signal is inactive, the selection switch 93 selects a second set value other than the first set value. The second set value, which is obtained by dividing the power supply voltage VDD, is selected in response to a test signal TEST supplied to the normal operation signal line AL. In test mode, therefore, a sense operation is performed using the second set value as the reference value Ref (to discriminate between 0 and 1).

According to the second embodiment described above, in test mode, not only tests on whether data can be read from and written to the unprogrammed e-fuse element 12 are conducted, but also a threshold value serving as a reference value to discriminate between 0 and 1 can be changed. It is thus possible to conduct these tests at different request levels. If the second set value is larger than the first set value, a criterion for discrimination becomes strict and thus a test that satisfies a high-level request can be conducted. On the other hand, if the second set value is smaller than the first set value, the criterion is reduced and thus a test that satisfies a low-level request can be conducted.

In both the first and second embodiments described above, an e-fuse element of a conductive film breakdown type as well as an insulating film breakdown type can be used as a storage element that is programmed with information by varying electrical properties irreversibly.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a storage element which is programmed with information by varying electrical properties irreversibly;
   a selection switch connected in series to the storage element;
   a protection element connected in parallel to the storage element to protect the storage element from irreversible variations of electrical properties when the storage element is unprogrammed;
   a first activation circuit which activates the selection switch;

a second activation circuit which activates the protection element in complement with the first activation circuit in normal mode; and a test circuit which conducts a test on the storage element while the second activation circuit is activating the protection element together with the first activation circuit in test mode.

2. The nonvolatile semiconductor memory device according to claim 1, wherein the storage element is an electrical fuse element of an insulating film breakdown type to which information is written only once by breaking an insulating film by applying a voltage to the insulating film.

3. The nonvolatile semiconductor memory device according to claim 1, wherein the storage element is an electrical fuse element of a conductive film breakdown type to which information is written only once by breaking a conductive film by applying a voltage to the conductive film.

4. The nonvolatile semiconductor memory device according to claim 1, wherein the test circuit includes:

a read circuit connected to the storage element to determine whether the storage element is programmed; and a threshold value generation circuit which supplies the read circuit with a threshold value for determination, the threshold value generation circuit changing the threshold value for determination in the test mode.

5. The nonvolatile semiconductor memory device according to claim 1, wherein the protection element decreases a voltage to be applied to the storage element when the storage element is unprogrammed.

6. The nonvolatile semiconductor memory device according to claim 5, wherein the storage element is an electrical fuse element of an insulating film breakdown type to which information is written only once by breaking an insulating film by applying a voltage to the insulating film.

7. The nonvolatile semiconductor memory device according to claim 5, wherein the storage element is an electrical fuse element of a conductive film breakdown type to which information is written only once by breaking a conductive film by applying a voltage to the conductive film.

8. The nonvolatile semiconductor memory device according to claim 1, wherein the test circuit conducts a test on the storage element without actually writing information to the storage element that is unprogrammed.

9. The nonvolatile semiconductor memory device according to claim 8, wherein the test circuit includes:

a read circuit connected to the storage element to determine whether the storage element is programmed; and a threshold value generation circuit which supplies the read circuit with a threshold value for determination, the threshold value generation circuit changing the threshold value for determination in the test mode.

10. A nonvolatile semiconductor memory device comprising:

a cell array including a plurality of storage cells arranged in matrix, each of the storage cells having a storage element which is programmed with information by varying electrical properties irreversibly, a selection switch connected in series to the storage element, and a protection element connected in parallel to the storage element to protect the storage element from irreversible variations of electrical properties when the storage element is programmed;

a row selection control circuit which activates row selection lines to each of which a given number of storage cells are connected;

a first activation circuit which activates the selection switch of the given number of storage cells connected to each of the row selection lines activated by the row selection control circuit;

a second activation circuit which activates the protection elements in complement with the first activation circuit in normal mode; and a test circuit which conducts a test on the storage element of each of the given number of storage cells connected to each of the row selection lines while the second activation circuit is activating the protection elements together with the first activation circuit in test mode.

11. The nonvolatile semiconductor memory device according to claim 10, wherein the storage element is an electrical fuse element of an insulating film breakdown type to which information is written only once by breaking an insulating film by applying a voltage to the insulating film.

12. The nonvolatile semiconductor memory device according to claim 10, wherein the storage element is an electrical fuse element of a conductive film breakdown type to which information is written only once by breaking a conductive film by applying a voltage to the conductive film.

13. The nonvolatile semiconductor memory device according to claim 10, wherein the test circuit includes:

a read circuit connected to the storage element to determine whether the storage element is programmed; and a threshold value generation circuit which supplies the read circuit with a threshold value for determination, the threshold value generation circuit changing the threshold value for determination in the test mode.

14. The nonvolatile semiconductor memory device according to claim 10, wherein the protection element decreases a voltage to be applied to the storage element when the storage element is unprogrammed.

15. The nonvolatile semiconductor memory device according to claim 14, wherein the storage element is an electrical fuse element of an insulating film breakdown type to which information is written only once by breaking an insulating film by applying a voltage to the insulating film.

16. The nonvolatile semiconductor memory device according to claim 14, wherein the storage element is an electrical fuse element of a conductive film breakdown type to which information is written only once by breaking a conductive film by applying a voltage to the conductive film.

17. The nonvolatile semiconductor memory device according to claim 10, wherein the test circuit conducts a test on the storage element without actually writing information to the storage element that is unprogrammed.

18. The nonvolatile semiconductor memory device according to claim 17, wherein the test circuit includes:

a read circuit connected to the storage element to determine whether the storage element is programmed; and a threshold value generation circuit which supplies the read circuit with a threshold value for determination, the threshold value generation circuit changing the threshold value for determination in the test mode.

19. The nonvolatile semiconductor memory device according to claim 10, wherein the protection elements of the given number of storage cells connected to each of the row selection lines activated by the row selection control circuit are inactivated in non-test mode.

* * * * *